United States Patent [19]

Mastroianni et al.

[11] Patent Number: 4,574,469

[45] Date of Patent: Mar. 11, 1986

[54] PROCESS FOR SELF-ALIGNED BURIED LAYER, CHANNEL-STOP, AND ISOLATION

[75] Inventors: Sal Mastroianni, Tempe; Carroll Casteel; Terry S. Hulseweh, both of Mesa, all of Ariz.

[73] Assignee: Motorola, Inc., Schaumburg, Ill.

[21] Appl. No.: 650,964

[22] Filed: Sep. 14, 1984

[51] Int. Cl.$^4$ .................. H01L 21/76; H01L 21/223; H01L 21/31; H01L 21/74

[52] U.S. Cl. .................. 29/576 W; 29/571; 29/578; 29/577 C; 29/576 B; 148/1.5; 148/175; 148/188; 148/DIG. 122; 148/DIG. 83; 148/DIG. 35; 148/DIG. 86; 148/DIG. 117; 357/49; 357/59

[58] Field of Search .................. 29/571, 578, 576 B, 29/576 W, 577 R, 577 C; 148/1.5, 175, 188, DIG. 122, DIG. 81, DIG. 83, DIG. 86, DIG. 35, DIG. 26, DIG. 37, DIG. 85, DIG. 103, DIG. 117; 357/40, 49, 59, 52, 54

[56] References Cited

U.S. PATENT DOCUMENTS

| | | | |
|---|---|---|---|
| 3,500,139 | 3/1970 | Frouin et al. | 148/175 X |
| 3,648,128 | 3/1972 | Kobayashi | 357/59 X |
| 3,825,450 | 7/1974 | Schoeff | 148/175 |
| 3,825,451 | 7/1974 | Schoeff | 148/175 |
| 4,057,823 | 11/1977 | Burkhardt et al. | 357/49 X |
| 4,109,273 | 8/1978 | Glasl et al. | 357/49 X |
| 4,135,954 | 1/1979 | Chang et al. | 148/187 |
| 4,160,991 | 7/1979 | Anantha et al. | 357/49 |
| 4,199,380 | 4/1980 | Farrell et al. | 148/1.5 |
| 4,209,349 | 6/1980 | Ho et al. | 357/49 X |
| 4,209,350 | 6/1980 | Ho et al. | 148/188 |
| 4,242,791 | 6/1981 | Horng et al. | 29/578 |
| 4,252,582 | 2/1981 | Anantha et al. | 148/175 |
| 4,255,207 | 3/1981 | Nicolay et al. | 148/174 |
| 4,272,776 | 6/1981 | Weidland et al. | 357/50 |
| 4,318,751 | 3/1982 | Horng | 148/1.5 |
| 4,333,794 | 6/1982 | Beyer et al. | 156/648 |
| 4,356,211 | 10/1982 | Riseman | 427/85 |
| 4,369,569 | 1/1983 | Muramatsu | 29/580 |
| 4,373,965 | 2/1983 | Smigelski | 148/1.5 |
| 4,376,336 | 3/1983 | Endo et al. | 29/571 |
| 4,378,627 | 4/1983 | Jambotkan | 29/571 |
| 4,381,953 | 5/1983 | Ho et al. | 148/1.5 |
| 4,381,956 | 5/1983 | Lane | 148/175 |
| 4,389,281 | 6/1983 | Anantha et al. | 156/646 |
| 4,404,735 | 9/1983 | Sakurai | 29/576 W |
| 4,443,935 | 4/1984 | Zamba et al. | 29/622 |
| 4,449,287 | 5/1984 | Maas et al. | 29/580 |
| 4,454,646 | 6/1984 | Joy et al. | 29/576 W |
| 4,454,647 | 6/1984 | Joy et al. | 29/576 W |
| 4,463,493 | 8/1984 | Momose | 29/576 B |
| 4,486,942 | 12/1984 | Hirao | 29/571 |

FOREIGN PATENT DOCUMENTS 0112489  7/1984  Japan .

Primary Examiner—Brian E. Hearn
Assistant Examiner—David A. Hey
Attorney, Agent, or Firm—Robert M. Handy

[57] ABSTRACT

A process is described for producing isolated semiconductor devices in a common substrate which have self-aligned and pre-located isolation walls, buried layers, and channel-stops. The isolation walls are formed from a stacked arrangement of a dielectric region and a non-single crystal semiconductor region, above a doped channel-stop region. A single mask layer determines the location and spacing of the non-single crystal portion of the isolation walls, the channel-stops, and the buried layers.

14 Claims, 14 Drawing Figures

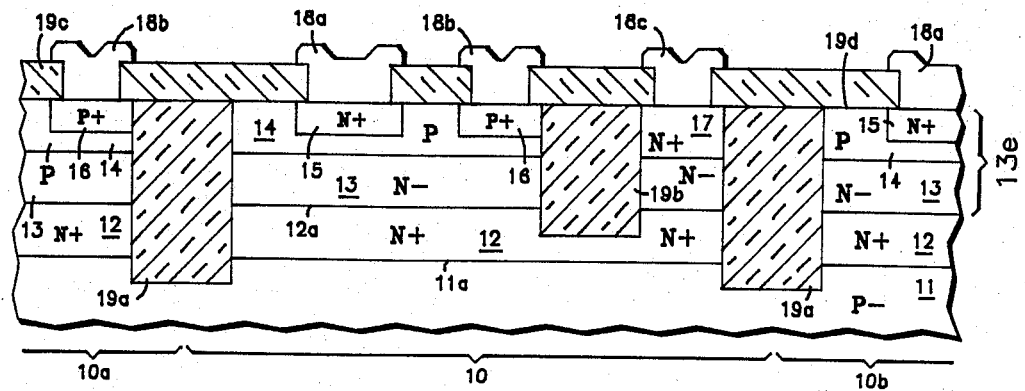
*FIG. 1A* — PRIOR ART —
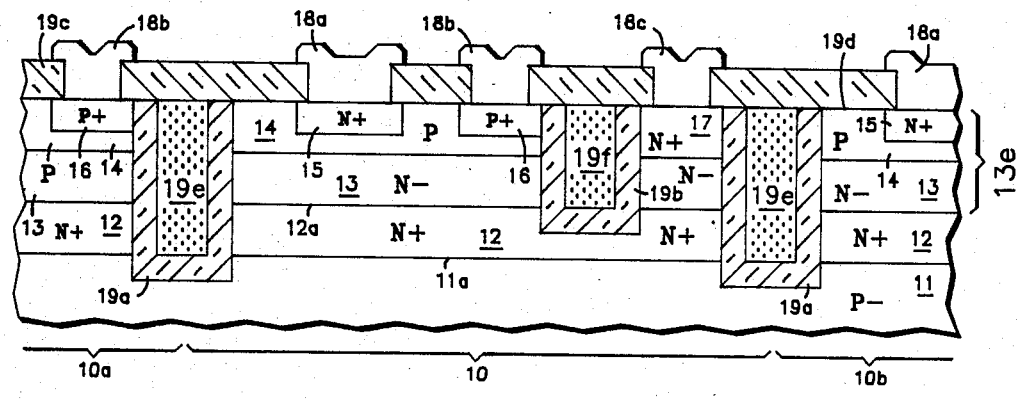
*FIG. 1B* — PRIOR ART —
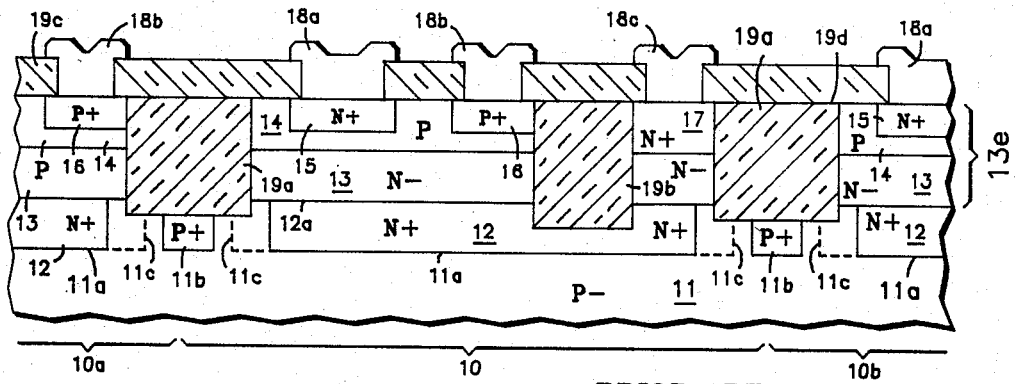
*FIG. 1C* — PRIOR ART —

PROCESS FOR SELF-ALIGNED BURIED LAYER, CHANNEL-STOP, AND ISOLATION

BACKGROUND OF THE INVENTION

This invention relates in general to methods for providing electrical isolation between devices fabricated in the same semiconductor substrate and, more particularly, to improved methods for isolating adjacent devices in integrated circuits.

BACKGROUND ART

It is commonplace in semiconductor device and integrated circuit technology to provide some means of controlling electrical coupling between devices in the same semiconductor substrate. Where the circuit design calls for the devices to have minimal electrical coupling, a variety of means are used to provide electrical isolation, for example, dielectric isolation, junction isolation, and combinations thereof. The utility of a particular isolation scheme is a complex function of both the structural arrangement and the method of fabrication. These factors interact to affect the performance, ease of manufacture, reliability, manufacturing yield, and cost of production of the resulting devices.

Historically, junction isolation has been the most widely used technique for integrated circuits. With this approach, diffused regions extend from the surface of the semiconductor wafer through the various active device layers to the underlying semiconductor substrate so as to form a P-N junction tub surrounding the isolated devices. Junction isolation suffers from a number of disadvantages which are well-known in the art.

More recently, it has become common to utilize dielectric regions rather than diffused regions as isolation walls. These dielectric regions penetrate from the surface of the semiconductor wafer to the underlying substrate and separate the adjacent device regions. In order to obtain dielectric isolation walls, a trench is etched in the semiconductor and then refilled with a dielectric material, typically silicon dioxide. The dielectric filler is either grown in place from the semiconductor material itself, or deposited from an external source.

However, prior art dielectric isolation techniques and fabrication methods suffer from one or more disadvantages, such as, for example, process complexity, high cost, incomplete isolation, lower manufacturing yield, poorer reliability, excessive die area consumption, and generation of excess material defects during manufacturing. Thus, a need continues to exist for isolation means and methods for semiconductor devices and integrated circuits which overcome or avoid one or more limitations of the prior art.

Accordingly, it is an object of the present invention to provide an improved means and method for electrical isolation of devices in a common semiconductor substrate, particularly for integrated circuits.

It is an additional object of the present invention to provide a manufacturing method for electrical isolation of adjacent devices which includes automatic self-alignment of buried layer regions, isolation regions, and channel-stop regions.

It is a further object of the present invention to provide a manufacturing method for electrical isolation of semiconductor devices which reduces defect generation during device manufacture.

It is an additional object of the present invention to provide a method for creating electrical isolation regions in semiconductor devices which incorporate an absorption sink adjacent to the active device regions for gettering heavy metals from the device regions.

It is a further object of the present invention to provide a manufacturing method for fabricating electrically isolated semiconductor devices wherein the lateral separation between the buried layer regions and the channel-stop regions can be readily and conveniently controlled.

It is an additional object of the present invention to provide a manufacturing method for isolating semiconductor devices in a common substrate wherein substrate damage during formation of the buried layer regions is substantially reduced so that a higher degree of perfection is obtained in subsequently formed overlying epitaxial layers.

It is a further object of the present invention to provide a manufacturing method for isolating semiconductor devices in a common substrate wherein the location and spacing of isolation walls, buried layers, and channel-stop regions is determined by a single masking layer.

It is an additional object of the present invention to provide a manufacturing method for isolating semiconductor devices in a common substrate utilizing a tub-to-tub isolation wall composed of a combination of superposed dielectric and polycrystalline semiconductor isolation regions above a diffused channel-stop region.

As used herein the words "polycrystalline" or "poly" are intended to refer to all non-single crystal forms of solids. As used herein, the words "dip etching" are intended to include all forms of blanket etching or erosion.

SUMMARY OF THE INVENTION

The attainment of the foregoing and other objects and advantages is achieved through the present invention wherein there is provided a process for fabricating semiconductor devices comprising providing a semiconductor substrate of a first conductivity type, forming an initial polycrystalline semiconductor layer on the substrate, providing an oxidation resistant masking layer on the polycrystalline layer which has open portions penetrating to and exposing first portions of the polycrystalline layer, and which has closed portions covering protected regions of the polycrystalline layer. The first portions of the polycrystalline layer exposed in the open portions of the masking layer are converted to first insulating dielectric regions. A portion of the masking layer is then removed to expose a second portion of the polycrystalline layer between a pair of the first insulating dielectric regions already formed, leaving third portions of the polycrystalline layer protected under the masking layer. First portions of the substrate underlying the exposed second portions of the polycrystalline layer are thereafter doped through the polycrystalline layer. Following doping of the substrate, the second portions of the polycrystalline layer are converted to second insulating dielectric regions. The third portions of the polycrystalline layer are then doped. This may be accomplished without further masking or alignment steps. The first and second portions of the insulating dielectric regions and the remaining portions of the masking layer are thereafter removed. A semiconductor layer is subsequently deposited on the substrate to form single crystal epitaxial regions above the first portions of the substrate and polycrystalline regions above the remaining third portions of the polycrystalline layer. The epitaxial regions and polycrystalline regions of this deposited layer are in contact. Starting at the surface of the deposited semiconductor layer, a portion of the polycrystalline region formed therein is converted to a dielectric isolation region which separates the epitaxial regions on either side of the polycrystalline region. The dielectric isolation region should not penetrate to the substrate.

It is desirable that the first portions of the substrate be doped by implanting dopant ions into the second portion of the polycrystalline layer and thereafter driving these dopant ions from the second portion of the polycrystalline layer into the first portion of the substrate. In this way, buried layer regions and overlying epitaxial regions can be formed which have substantially fewer material defects. It is further desirable that the initial polycrystalline layer be an undoped polycrystalline semiconductor layer.

After the first and second portions of the polycrystalline layer have been converted to an insulating dielectric region, the third portions of the polycrystalline layer are doped with a dopant of the same conductivity type as the substrate. It is further desirable that this doping of the third portions of the polycrystalline semiconductor layer be of such intensity as to provide a diffusion source for increasing the doping density of the substrate regions immediately underlying the third portions of the polycrystalline layer, and for counterdoping the polycrystalline region formed in contact with the epitaxial layer to have the same type as the substrate even though formed from oppositely doped material.

BRIEF DESCRIPTION OF THE DRAWINGS

FIGS. 1A-C show simplified schematic cross-sectional views of a portion of a semiconductor device, according to the prior art, illustrating known dielectric isolation schemes.

DETAILED DESCRIPTION OF THE DRAWINGS

Figure 2A:
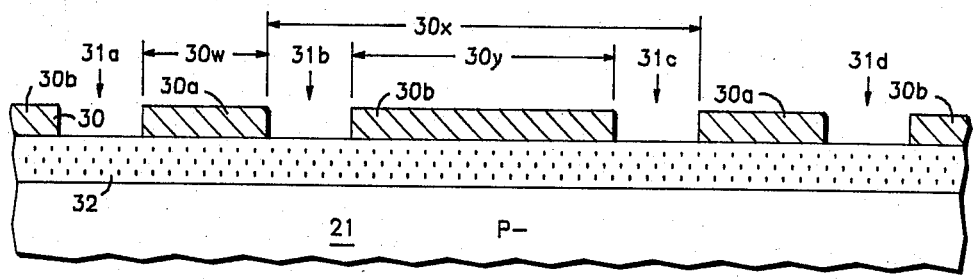
FIGS. 2A-K show simplified schematic cross-sectional views of a portion of a semiconductor device according to the present invention at different stages of fabrication.

For purposes of explanation, the device structures illustrated herein are shown as bipolar devices having particular combinations of N and P layers. However, those of skill in the art will understand that these device structures and doped layer combinations are presented merely as an aid to understanding and are not intended to be limiting, and that other combinations of N and P layers or regions and other device types can equally well be used and fabricated according to the teachings of the present invention.

FIGS. 1A-C show in schematic form simplified cross-sections of portions of prior art semiconductor devices 10 and 10a-b having P− substrate 11, N+ buried layer 12, N− epitaxial region 13 which serves as the collector of bipolar devices 10 and 10a-b, P base region 14, N+ emitter 15, P+ base contact region 16, N+ collector contact region 17, emitter electrode 18a, base electrode 18b, and collector electrode 18c. In FIGS. 1A-C, deep dielectric isolation regions 19a separate device region 10 from adjacent device regions 10a-b. Dielectric regions 19a penetrate from surface 19d of device 10 into substrate 11 beneath junction 11a so as to separate buried layer regions 12, collector regions 13, and base regions 14 of adjacent devices 10, 10a, and 10b.

Dielectric isolation region 19b is used to separate base region 14 from collector contact region 17. Region 19b need only extend from surface 19d of device 10 through interface 12a between N-type regions 12 and 13. Conventional dielectric layer 19c is used to passivate the surface of the devices.

The device of FIG. 1B is similar to the device of FIG. 1A except that the isolation regions consist of dielectric outer regions 19a-b with polycrystalline semiconductor cores 19e-f. Dielectric regions 19a-b are shown crossed hatched in FIGS. 1A-C, and polycrystalline cores 19e-f are stippled in FIG. 1B.

The device of FIG. 1C is similar to the device of FIG. 1A except that highly doped P+ regions 11b are provided beneath dielectric isolation regions 19a to act as channel-stops to reduce leakage around the isolation regions. Buried layers 12 may be spaced apart from isolation regions 19a, as illustrated by solid line 11a in FIG. 1C, or may intersect isolation regions 19a, as illustrated by dashed lines 11c in FIG. 1C. However, a separate masking and alignment step is generally required in the prior art to locate buried layers 12 of FIG. 1C with respect to isolation walls 19a and channel-stops 11b.

The device illustrated in FIGS. 1A-C suffer from a number of disadvantages. For example, deep dielectric regions 19a are difficult to form, thereby increasing process complexity and cost. Further, the dielectric material has a different coefficient of expansion than the semiconductor material. As the device is heated during various manufacturing steps, the differential thermal expansion subjects the semiconductor device to mechanical stress and introduces material defects which degrade both performance and reliability. The larger the volume of dielectric material, the greater the severity of this effect.

In addition, the deep isolation regions consume large amounts of device area since, the deeper the isolation region the wider it must be and the greater the alignment tolerance which must be provided. Also, the dielectric itself frequently causes a change in conductivity in the adjacent semiconductor material so that a leakage path is formed beneath and around the dielectric isolation regions. While some of these deficiencies are ameliorated by the structures of FIGS. 1B-C, others are created. For example, a separate buried layer alignment and masking operation is required with the structure of FIG. 1C in order to prevent N+ buried layer 12 from contacting P+ channel-stop 11b. Such contact is undesirable since it can degrade device performance and yield.

Processes for fabricating the prior art structures of FIGS. 1A-C are well-known in the art. A typical prior art procedure consists of the following steps: (1) providing semiconductor substrate 11; (2) forming therein buried layer regions 12 by direct doping of substrate 11, generally by ion implantation or by diffusion from a doped oxide; (3) growing epitaxial layer 13e adapted to contain collector regions 13, base regions 14, and emitter regions 15; (4) providing on surface 19d of epitaxial layer 13e an etch resistant masking layer having openings corresponding to isolation regions 19a; (5) etching trenches in epitaxial layer 13e reaching through to underlying substrate 11 and corresponding to the desired location of dielectric isolation regions 19a; (6) growing or depositing oxide in the trenches to form dielectric isolation regions 19a of FIGS. 1A or C, or alternatively, growing thin oxide outer regions 19a as shown in FIG. 1B and subsequently, depositing polycrystalline regions 19e to fill the trenches; (7) repeating the etch and refill process to form dielectric isolation regions 19b; (8) masking surface 19d of epitaxial layer 13e and doping base regions 14; (9) masking surface 19d and providing dopant to form emitter regions 15, base contact regions 16, and collector contact regions 17; and (10) forming device contacts 18a-c through openings in surface passivation layer 19c. For the variation illustrated in FIG. 1C, channel-stop region 11b is formed beneath dielectric isolation region 19a by adding a masking and doping step prior to growing epitaxial layer 13e or after the trenches for dielectric regions 19a are opened, but before dielectric regions 19a are formed.

The above-described process suffers from a number of disadvantages, among which are that it yields a less than optimized isolation structure, that it requires a large number of process steps, particularly masking operations, and that the direct doping of substrate 11 to form buried layer regions 12, either by ion implantation or diffusion, introduces an unnecessarily large concentration of material defects. These defects degrade the properties of the subsequently formed epitaxial layer in which the critical device regions will be formed.

These and other limitations and disadvantages of the prior art may be overcome with the methods and means of the present invention. FIGS. 2A-K show simplified cross-sectional views of a portion of a semiconductor device, according to the present invention, at various stages of manufacture. FIGS. 2A-K illustrate the manufacturing process as applied to a typical densely packed bipolar integrated circuit in which isolation walls are to be provided between adjacent bipolar transistors. For convenience in presenting a description of the process, bipolar transistor structures are illustrated having a typical combination of N and P layers or regions. However, those of skill in the art will understand that this is merely exemplary and not intended to be limiting and that the fabrication process described herein can be applied to other semiconductor device types and other combinations of N and P layers or regions. The adjacent isolated transistors are illustrated as having mirror symmetry with regard to the isolation walls, but this is not essential.

In FIG. 2A, P-type semiconductor substrate 21 is covered with polycrystalline semiconductor layer 32, conveniently of the same semiconductor material as substrate 21. Poly-layer 32 is shown stippled. For manufacturing high density bipolar integrated circuits a thickness of approximately 0.1 microns for poly-layer 32 is suitable. However, other thicknesses can also be used. Methods for depositing poly-layers are well-known in the art. Poly-layer 32 is covered by masking layer 30 in which are provided openings 31a-d penetrating to poly-layer 32. Portions 30a and 30b of masking layer 30 protect those portions of poly-layer 32 not exposed in openings 31a-d. Width 30w of mask portion 30a substantially determines the lateral thickness of the isolation walls which will be formed by the described process. Width 30y of mask portion 30b substantially determines the lateral width of the buried layer regions which will be formed in substrate 21 during a subsequent step. Width 30x, which is the sum of the widths of mask portion 30b and open portions 31b and 31c, substantially determines the isolation wall-to-isolation wall spacing, i.e., the width of the isolated tub within which the individual semiconductor device is fabricated. The separations between the buried layer regions and the channel-stop regions is determined by the widths of openings 31a-d. Since widths 30w and 30y, and the widths of openings 31a-d may be independently varied, the invented process provides great design flexibility while still preserving automatic alignment of the buried layers, isolation walls, and channel-stop. This is an important advantage.

Figure 2B:
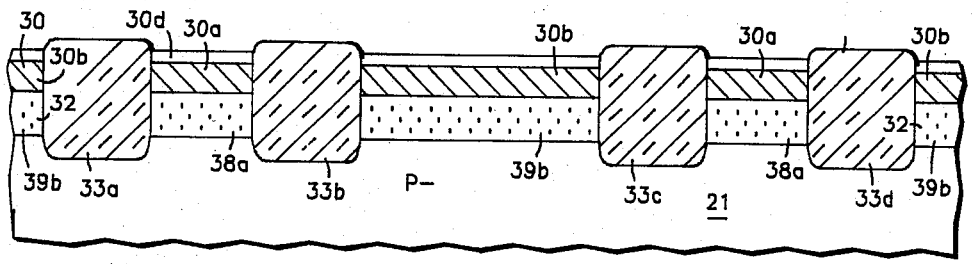
Figure 2C:
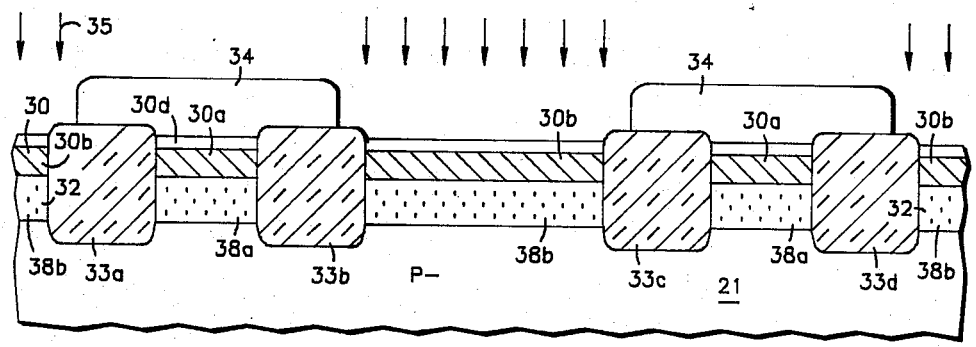

Mask layer 30 is desirably of a material which is resistant to oxidation. Silicon nitride having a thickness in the range 0.05 to 0.1 microns is suitable for use as the material of mask layer 30. Poly-layer 32 is conveniently oxidized through openings 31a-d of mask layer 30 to form dielectric regions 33a-d. It is desirable that dielectric regions 33a-d extend completely through poly-layer 32 to substrate 21, as illustrated in FIG. 2B. If high temperature thermal oxidation is used to form dielectric regions 33a-d, a small portion of mask layer 30 may be converted to oxide as is illustrated by thin surface layer 30d. Other methods may be employed in order to obtain dielectric regions 33a-d such as, for example, etching away those portions of layer 32 exposed in openings 31a-d and then refilling the etched cavities by depositing dielectric regions 33a-d. However, this is less convenient.

A masking layer is then spread over the semiconductor wafer and patterned (FIG. 2C) to provide masked regions 34 protecting portions 30a of mask layer 30 and regions 38a of poly-layer 32. Mask portions 34 need not be precisely aligned since they can lap over onto dielectric portions 33a-d. Mask portions 34 must be of sufficient thickness and of a material suitable to mask underlying poly-regions 38a against ion implantation as indicated by arrows 35 in FIG. 2C. Mask portions 34 may conveniently be of photoresist. It will be understood by those of skill in the art that ions 35 impinge on the whole surface of the wafer including mask portions 34.

Ion implantation is conveniently used to dope regions 38b of poly-layer 32 exposed through the openings in mask portions 34. Generally, for a bipolar device, dopant ions 35 will be of the opposite conductivity type as substrate 21 in order that they may be subsequently used to create buried layer regions 22 in substrate 21. The ion implantation step indicated by arrows 35 may be performed through portions 30b of masking layer 30, as in FIG. 2C. Alternatively, portions 30b of masking layer 30 may be removed and ions 35 implanted directly into regions 38b of poly-layer 32, as in FIG. 2D. While ion implantation is a convenient means of doping regions 38b of poly-layer 32, other well-known doping techniques may also be used. It is preferable, however, that regions 38b be doped at relatively low temperatures, i.e., below about 900° C.

Portions 30b of mask layer 30 are removed, either before or after implantation of ions 35, to expose surface 32a of portions 38b of poly-layer 32. Mask layer regions 34 continue to protect portions 30a of mask layer 30 and portions 38a of poly-layer 32 during this operation. A dip etching step is conveniently used and no separate alignment or masking operation is required to removed portions 30b. Mask layer portions 34 are then removed.

Figure 2D:
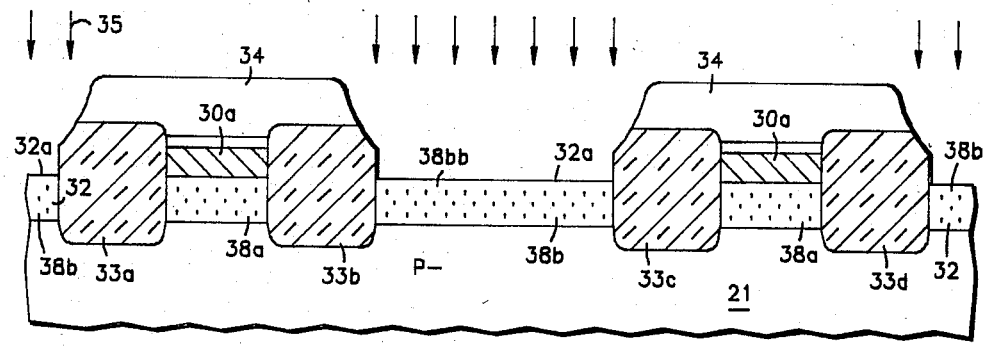
Figure 2E:
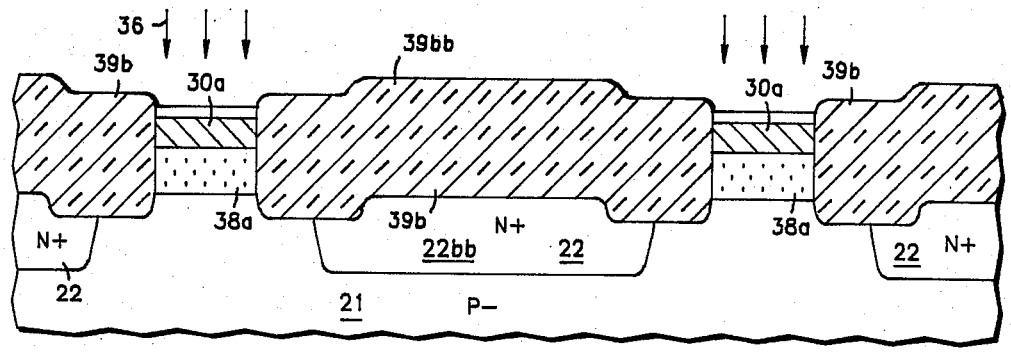
Figure 2F:
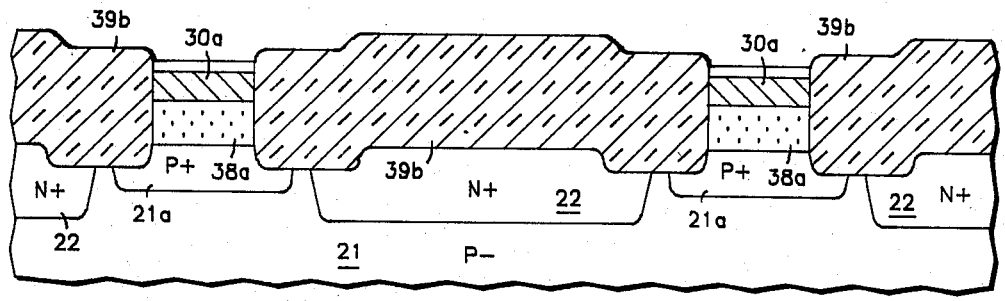
Figure 2G:
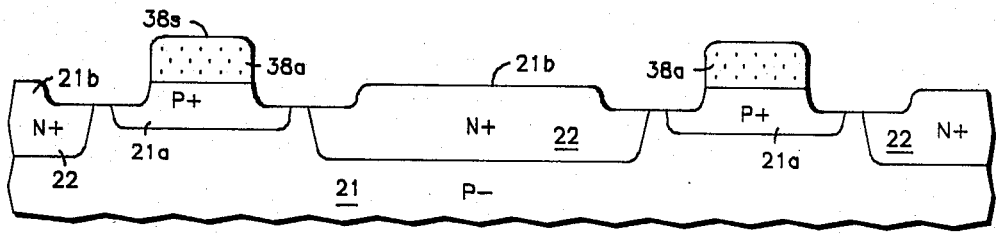

The semiconductor wafer is then heated to drive dopant ions 35 from poly-regions 38b into substrate 21 in order to form buried layer regions 22 (FIG. 2E). Regions 38b of poly-layer 32 are also oxidized to completion so that each buried layer region 22 is covered by thick dielectric layer 39b. For example, region 38bb shown at the center of FIG. 2D is converted to oxide region 39bb in FIG. 2E. Oxide region 39bb joins together pre-existing oxide regions 33b and 33c to form continuous dielectric layer 39b covering buried layer region 22bb. The drive-in and oxidation steps may be performed separately or simultaneously. Simultaneous oxidation and drive-in is convenient since oxidation of doped poly-layer portions 38b pushes dopant ions 35 from layer portions 38b into substrate 21 to form buried layers 22 while oxidation is proceeding.

As further indicated in FIG. 2E, portions 38a of poly-layer 32 are then doped, conveniently by ion implantation as indicated by arrows 36. If ion implantation is used for doping polycrystalline regions 38a, it may be conveniently performed directly through mask layer portion 30a. Alternatively, mask layer portions 30a may be removed by dip etching without any separate masking or alignment operations and portions 38a doped by ion implantation or alternative methods. Dopant ions 36 are desirably of the same conductivity type as substrate 21. Doped polycrystalline regions 38a then act as sources for diffusion of dopant ions 36 into substrate 21 immediately beneath regions 38a in order to form channel-stop regions 21a. It should be noted that channel-stop regions 21a are automatically self-aligned directly beneath poly-regions 38a (see FIG. 2F). Following the doping of poly-regions 38a, thick oxide layers 39b are removed by dip etching in order to expose upper surface 21b of substrate 21, as in FIG. 2G. Portions 30a of layer 30, if not previously removed, are also removed by dip etching. No separate masking or alignment steps are necessary.

While the described process is illustrated for the sequence in which the buried layers are formed first and the channel-stop regions are formed second, the process can also be carried out by forming the channel stops first and the buried layers second. However, an additional masking layer must be applied if reverse order is used. When it is desired to form the channel-stops first, mask 30 is formed as before and then mask 34 applied over portions 30b rather than 30a. Ions 36 are then implanted first into regions 38a. Portions 30a are then protected by an additional mask and portions 30b opened so that ions 35 can be implanted in regions 38b. After buried layers 22 are formed, the surface layers, except regions 38a are stripped to expose substrate surface 21b and surface 38s of regions 38a.

Figure 2H:
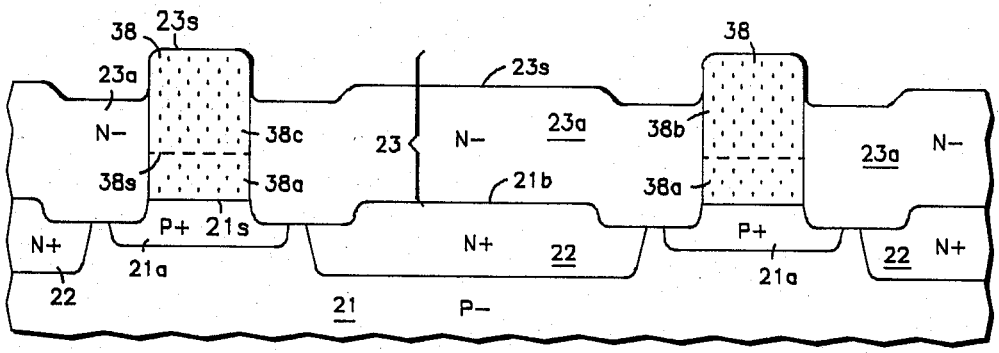

Semiconductor layer 23 is thereafter deposited on surface 21b of substrate 21 and surface 38s of poly-regions 38a (FIG. 2H). The conditions for deposition or formation of semiconductor layer 23 are arranged, using means well-known in the art, so that portions 23a of semiconductor layer 23 formed above substrate 21 and buried layer 22 are epitaxial, that is, have the same single crystal structure as substrate 21, and portions 38c formed on surface 38s of poly-regions 38a are polycrystalline. For silicon, deposition of layer 23 is conveniently carried out at 1000° C. at a pressure of 80 Torr (10.64 kPa), using di-chlorosilane as a source gas. However, other conditions generally in the range 900° to 1200° C. and 60 to 100 Torr (7.98 to 13.3 kPa) can also be used.

As indicated in FIG. 2H, when layer 23 is grown, epitaxial regions 23a and poly-regions 38c propagate approximately vertically above substrate 21 and poly-regions 38a, respectively, without substantial lateral broadening of poly-regions 38c. Poly-regions 38a and 38c combine to give poly-regions 38 extending substantially from surface 21s of substrate 21 above channel-stop region 21a to exterior surface 23s of layer 23.

Figure 2I:
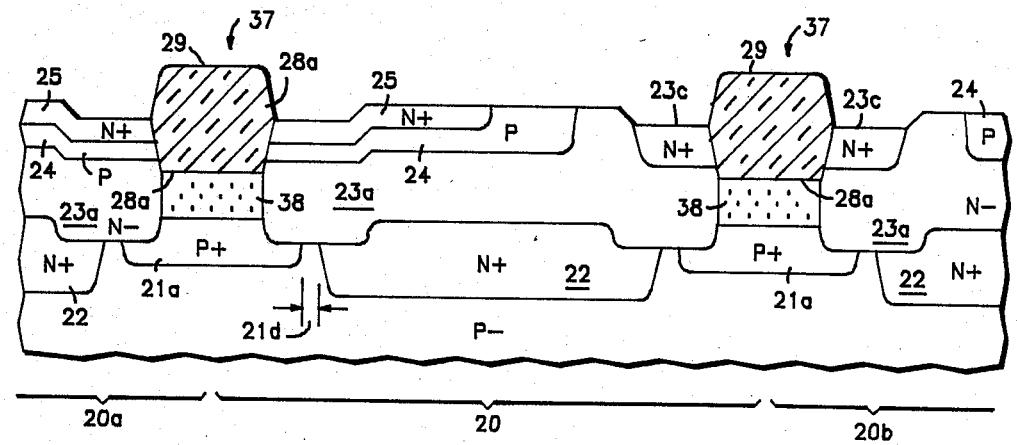
Figure 2J:
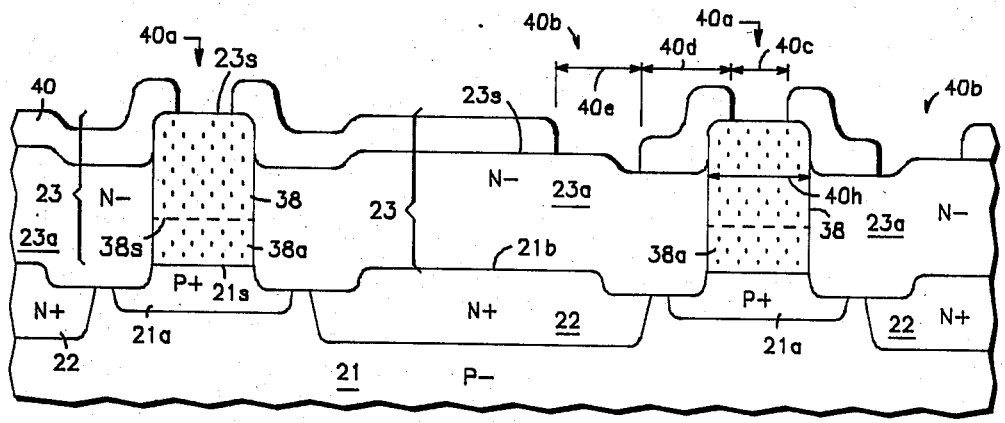

A masking layer (not shown), similar to masking layer 40 of FIG. 2J but containing only openings 40a, is then applied over the structure of FIG. 2H with openings aligned approximately above poly-regions 38. This masking layer must be oxidation resistant. Such masking layers are well-known. Silicon nitride is a convenient material. The upper portions of poly-regions 38 are then converted to dielectric isolation regions 29, as indicated in FIG. 2I. Thermal oxidation is a preferred technique although etch and refill techniques can alternatively be used. Dielectric isolation regions 29 extend to interface 28a in poly-regions 38. Dielectric isolation regions 29 should not extend to substrate 21. Dielectric isolation regions 29 extend laterally to single crystal regions 23a of layer 23, and may encroach slightly therein.

Following the formation of dielectric isolation regions 29, the semiconductor wafer may be subjected to further conventional processing, well-known in the art, in order to provide base regions 24, emitter regions 25, collector contact regions 23c, and other conventional device portions.

The particular device structure illustrated in FIG. 2I is of the type known as a "walled base" and "walled emitter" structure, in that the junctions of base regions 24 and emitter regions 25 intersect dielectric isolation regions 29 directly. When a walled structure is desired, interfaces 28a between dielectric regions 29 and poly-regions 38 must lie below the intersecting junction. The structure of FIG. 2I illustrates the situation in which semiconductor device 20 is isolated from semiconductor devices 20a-b by isolation walls 37 composed of a superposed structure of dielectric regions 29, poly-regions 38, and underlying channel-stop regions 21a.

A particular feature of the invented process is that buried layers 22 may be formed using portions of poly-layer 32 as a dopant diffusion source without any need to provide a separate layer for this purpose. When buried layer 22 is formed using the poly-layer as the dopant source, it has been found that far fewer structural defects are created in the surface of substrate 21 than when buried layer 22 is formed by other doping means. The reduction of surface defects is especially noted when comparing direct ion implantation of buried layer 22 into substrate 21 and indirect implantation via poly-layer 32. For indirect implantation, dopant ions 35 are implanted in portions 38b of poly-layer 32 and do not impinge directly on substrate 21. Buried layers 22 are formed by thermal diffusion of ions 35 from layer portions 38b into substrate 21. As a consequence of the reduction in the number of surface defects associated with the formation of buried layers 22, epitaxial regions 23a grown over buried layer 22s and substrate 21 have a much higher degree of perfection. This substantially improves the performance of devices 20 and 20a-b fabricated within region 23a of epitaxial layer 23 encompassed within isolation walls 37.

A further advantage of the described process is that dielectric regions 29 need not extend to substrate 21, but can be substantially shallower, generally one half or less the depth of substrate 21. As a consequence, the total volume of dielectric material which must be used for isolation purposes is substantially reduced. Since the dielectric materials generally have a different expansion coefficient than the semiconductor materials, it is highly advantageous to use isolation schemes which minimize the amount of dielectric material required, since this produces isolation walls which have an averge coefficient of expansion more closely matching that of the semiconductor material.

Device 20 and 20a-b are formed in the device tubs located between isolation walls 37. An advantage of the above described process is that the location and dimensions of the isolation walls, the device tubs, the buried layers and the channel-stop are all determined by the spacing and size of openings 31a-d placed in single masking layer 30. Thus, no further alignment is required in order to locate buried layers 22 with respect to poly-regions 38 and channel-stops 21a of isolation walls 37. This is extremely important in the fabrication of high density and high performance devices since no alignment tolerances need be allocated in connecting with these device regions and overall device and circuit area is reduced. Another area saving aspect of the present process is that poly-regions 38 can be kept relatively narrow (laterally) since they have little tendency to spread laterally during growth of layer 23. In addition, since dielectric regions 29 need not be very deep their lateral spread during oxidation is minimized. Also, since poly-regions 38c tend to oxidize more rapidly than adjacent single crystal regions 23a, the alignment step for locating dielectric regions 29 can be less precise and the amount of space provided for the alignment tolerance can be reduced. Also, there is less spreading of regions 29 into single crystal regions 23a during formation of regions 29. These effects combine to permit isolation wall 37 to be relatively thin (laterally) thereby further conserving device area.

An additional feature of the present invention is that separation 21d between buried layers 22 and channel-stops 21a can be controlled by varying the widths of mask openings 31a-d. Those of skill in the art will understand that in choosing the widths of openings 31a-d in order to provide a given finished separation 21d between buried layers 22 and channel-stops 21a, one must take into account the lateral spreading of doped regions 22 and 21a during the thermal processes to which the semiconductor wafer is subjected. Means for calculating the lateral spreading of doped regions are well-known in the art. It should be particularly noted that separation 21d is determined, taking into account lateral spreading, by the dimensions of the openings provided in initial mask layer 30. Thus, separation 21d is not dependent upon any intermediate alignment steps. Thus, separation 21d may be made very uniform and carefully controlled.

A further advantage of the present structure is that poly-layer 32 is in contact with substrate 21 and epitaxial regions 23a during a significant number of thermal processing cycles in the manufacture of the finished device. It is well-known, that polycrystalline semiconductor regions or layers act preferentially as a sink for trapping heavy metal contamination which may be present in semiconductor wafers or inadvertently introduced during processing. Thus, layer 32 tends to getter heavy metals from substrate 21. Further, polycrystalline regions 38 which remain as a part of isolation walls 37 located immediately adjacent to active device regions 23a, 24 and 25, also serve to getter heavy metals from portions 23a of layer 23 in which active device regions 20 and 20a-b are formed. This occurs during device processing and use, and provides a desirable stabilizing affect on device characteristics.

Figure 2K:
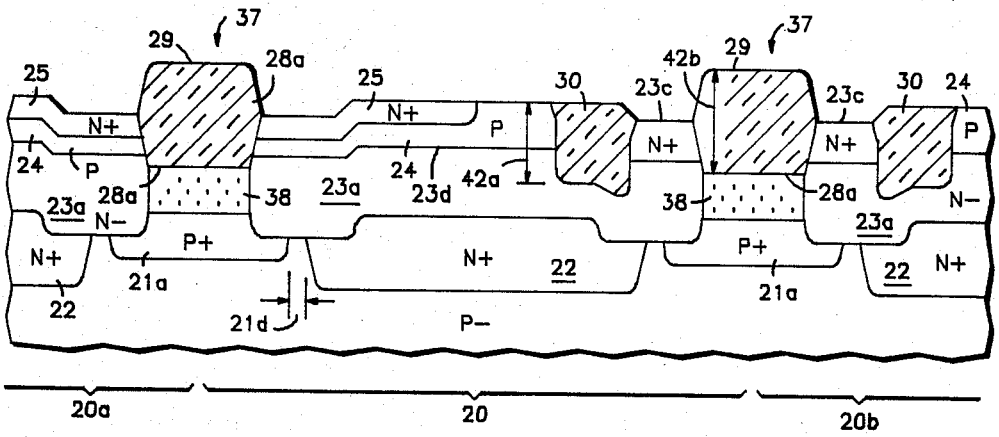

FIGS. 2J-K illustrate an alternative embodiment of the invented process wherein additional dielectric isolation regions 30 are provided to separate base regions 24 and collector contact regions 23c (FIG. 2K). This is accomplished by first covering the structure of FIG. 2H with masking layer 40 on surface 23s, wherein masking layer 40 has openings 40a-b, as in FIG. 2J. Masking layer 40 must be oxidation resistant. Silicon nitride is a suitable material. Means for forming and patterning silicon nitride masking layers are well-known in the art.

Openings 40a in layer 40 are located above poly-regions 38. Width 40c of opening 40a can be smaller than width 40h of poly-region 38, since dielectric regions 29 formed through openings 40a will grow wider than openings 40a during oxidation of regions 38. Openings 40a need not be precisely centered over regions 38 since dielectric regions 29 will grow more rapidly in non-single crystal regions 38 than in adjoining single crystal regions 23a. Thus, if a first side wall of oxide region 29, growing in region 38, reaches a first single crystal region 23a before the other side wall reaches the second single crystal region 23a on the opposite side of region 29, then lateral oxidation at the first side wall will slow down in the single crystal region, while oxidation at the second side wall, still in the poly-region, continues at the original rate until it reaches the opposite single crystal region. This provides a self-limiting action which compensates for lateral misalignment of openings 40a above regions 38.

Openings 40b are located above single crystal regions 23a. Openings 40a determine the location of dielectric isolation walls 30 which are formed through openings 40b. Separation distance 40d determines, taking into account lateral oxidation, the separation of dielectric isolation regions 29 and 30. Depth 42a of dielectric region 30 will generally be equal or less than depth 42b of dielectric region 29. This is due to the fact that oxidation can proceed more rapidly in non-single crystal regions 38. Where a walled base structure is desired, as is shown in FIG. 2K, depth 42a of dielectric region 30 must be greater than the depth of base-collector junction 23d.

A particular advantage of the present invention is that only a single masking step is needed to locate and produce dielectric isolation regions 29 and 30. Mask layer 40 with self-aligned openings 40a-b locates both dielectric isolation regions 29 and 30. In the prior configurations of FIGS. 1A-B, dielectric isolation regions 19a-b are of different depths, hence two separate masking and dielectric formation operations are required. In the prior art configuration of FIG. 1C, regions 19a-b have the same depth and so may be formed at the same time with a single mask. However, an additional masking step is required to produce separated buried layer regions 12 and channel-stop regions 11b in FIG. 1C, whereas in the present invention, these are aligned by a single mask. Thus, the configuration of FIG. 2K, prepared according to the method of the present invention, can be obtained with fewer masking steps than in the prior art.

Having thus described the invention, it is apparent that the present invention provides an improved method for constructing multiple isolated devices in a common semiconductor substrate. The described method is particularly suitable for use in integrated circuits. The invented process makes possible the use of walled base and emitter structures while minimizing the depth and lateral extent of the dielectric isolation regions employed. It is further apparent that the invented process provides a particularly effective and simple means for fabricating isolated device regions having improved characteristics with the same or fewer masking and alignment steps. The dimensions and locations of the buried layers, poly-isolation walls, and channel-stops are determined by a first single mask pattern. The dielectric isolation regions are formed using a second mask pattern. The two mask patterns need not be precision aligned.

While the invented process has been illustrated in terms of particular combinations of conductivity and device types, those of skill in the art will recognize that these are merely intended to be illustrative, and that the invented method can be used in connection with other combinations of conductivity types and other types of devices. Accordingly, it is intended to include all such variations within the claims which follow.

We claim:

1. A process for fabricating semiconductor devices comprising:
   providing a semiconductor substrate of a first conductivity type;
   forming an initial polycrystalline semiconductor layer on said substrate;
   providing an oxidation resistant masking layer on said polycrystalline layer having open portions penetrating to and exposing first portions of said polycrystalline layer and closed portions covering protected regions of said polycrystalline layer;
   converting to first insulating dielectric regions said first portions of said polycrystalline layer exposed in said open portions;
   removing a portion of said masking layer to expose second portions of said polycrystalline layer between a pair of said first insulating dielectric regions, leaving third portions of said polycrystalline layer protected under said masking layer;
   doping first portions of said substrate underlying said second portions of said polycrystalline layer;
   converting said second portions of said polycrystalline layer to second insulating dielectric regions;
   doping said third portions of said polycrystalline layer with a dopant of said first conductivity type without further masking steps;
   removing said first and second portions of said insulating dielectric regions and any remaining portions of said masking layer;
   forming epitaxial regions of semiconductor material above said first portions of said substrate in contact with and separated by third portions of said polycrystalline layer;
   forming a further polycrystalline region above at least part of said third portion of said polycrystalline layer and in contact with said epitaxial regions; and
   converting a part of said further polycrystalline region to a dielectric isolation region separating said epitaxial regions and not penetrating to said substrate.

2. The process of claim 1 wherein said first forming step comprises forming a substantially undoped initial polycrystalline layer.

3. The process of claim 2 wherein said first doping step comprises ion implanting said second portions of said polycrystalline layer with a first dopant and thereafter driving said first dopant into said first portions of said substrate to form a buried layer.

4. The process of claim 3 wherein said second providing step comprises providing open portions in said masking layer of a predetermined width for establishing the lateral separation of said buried layer and a channel-stop region.

5. The process of claim 1 wherein said second and third forming steps proceed simultaneously.

6. The process of claim 1 wherein said first doping step comprises converting said first portion of said substrate to a second conductivity type different than said first conductivity type.

7. The process of claim 6 wherein said second forming step comprises forming an epitaxial layer of said second conductivity type.

8. The process of claim 1 further comprising doping a second portion of said substrate underneath said third portion of said polycrystalline layer to a higher level of said first conductivity type.

9. A process for fabricating isolated semiconductor devices in a substrate, comprising:
   forming a non-single crystal semiconductor layer on a major surface of said substrate;
   covering said non-single crystal layer with a first oxidation resistant mask layer having open portions exposing first portions of said non-single crystal layer;
   replacing said first portions of said non-single crystal layer with a first dopant resistant mask material;
   covering said first oxidation resistant mask layer with a second dopant resistant mask material having open portions above second portions of said non-single crystal layer;
   doping said second portions of said non-single crystal layer with a first dopant;
   driving said first dopant from said second portions of said non-single crystal layer into said substrate to form first doped regions in said substrate;
   replacing said second portions of said non-single crystal layer by a third dopant resistant mask material contiguous with said first dopant resistant mask material;
   removing said second dopant resistant mask material;
   doping third portions of said non-single crystal semiconductor layer previously protected by said second dopant resistant mask material with a second dopant;
   driving said second dopant from said third portions of said non-single crystal layer into said substrate to form second doped regions in said substrate;
   exposing a surface having a first part comprising said third portions of said non-single crystal layer and a second part comprising portions of said major surface of said substrate not covered by said third portions of said non-single crystal layer;
   forming on said exposed surface a semiconductor layer comprising a non-single crystal portion over said first part and a single crystal portion over substantially said second part; and
   replacing a part of said non-single crystal portion with a dielectric region.

10. A process for fabricating isolated semiconductor device in a substrate, comprosing:
    forming a non-single crystal semiconductor layer on a major surface of said substrate;
    convering said non-single crystal layer with a first oxidation resistant mask layer having open portions exposing first portions of said non-single crystal layer;
    replacing said first portions of said non-single crystal layer with a first dopant resistant mask material;

covering said first oxidation resistant mask layer with a second dopant resistant mask material having open portions above second portions of said non-single crystal layer;

doping said second portions of said non-single crystal layer with a first dopant;

driving said first dopant from said second portions of said non-single crystal layer into said substrate to form first doped regions in said substrate;

removing said second dopant resistant mask material;

replacing said second portions of said non-single crystal layer by a third dopant resistant mask material contiguous with said first dopant resistant mask material;

doping third portions of said non-single crystal semiconductor layer previously protected by said second dopant resistant mask material with a second dopant;

driving said second dopont from said third portions of said non-single crystal layer into said substrate to form second doped regions in said substrate;

exposing a surface having a first part comprising said third portions of said non-single crystal layer and a second part comprising portions of said major surface of said substrate not covered by said third portions of said non-single crystal layer;

forming on said exposed surface a semiconductor layer comprising a non-single crystal portion over said first part and a single crystal portion over substantially said second part; and replacing a part of said non-single crystal portion with a dielectric region.

11. The process of claim 9 or 10 wherein said third replacing step comprises replacing a part of said non-single crystal region with a dielectric region which extends to a surface of said semiconductor layer and which does not extend to said substrate.

12. The process of claim 11 wherein said third replacing step further comprises replacing a part of said single crystal region with a dielectric region which extends to a surface of said semiconductor layer and which does not extend to said substrate.

13. The process of claim 9 or 10 wherein said third replacing step comprises replacing a part of said non-single crystal region and a part of said single crystal region with spaced apart dielectric regions which extend to a surface of said semiconductor layer and which do not extend to said substrate.

14. The process of claim 13 wherein said spaced apart dielectric regions are formed simultaneously.

* * * * *